United States Patent
Usami

(10) Patent No.: US 10,388,675 B2
(45) Date of Patent: Aug. 20, 2019

(54) MATRIX DEVICE AND MANUFACTURING METHOD OF MATRIX DEVICE

(71) Applicant: FUJIFILM Corporation, Tokyo (JP)

(72) Inventor: Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/712,265

(22) Filed: Sep. 22, 2017

(65) Prior Publication Data

US 2018/0012908 A1    Jan. 11, 2018

Related U.S. Application Data

(63) Continuation of application No. PCT/JP2016/057083, filed on Mar. 8, 2016.

(30) Foreign Application Priority Data

Mar. 26, 2015  (JP) .................................. 2015-064349

(51) Int. Cl.
  *H01L 27/12* (2006.01)
  *G02F 1/1345* (2006.01)
  (Continued)

(52) U.S. Cl.
  CPC .......... *H01L 27/124* (2013.01); *G02F 1/1345* (2013.01); *G02F 1/1368* (2013.01);
  (Continued)

(58) Field of Classification Search
  None
  See application file for complete search history.

(56) References Cited

U.S. PATENT DOCUMENTS 5,052,785 A * 10/1991 Takimoto .......... G02F 1/133514
                                                  349/108
5,359,441 A * 10/1994 Mori ....................... G02F 1/135
                                                  349/143
(Continued)

FOREIGN PATENT DOCUMENTS

JP    2004-258626 A    9/2004
JP    2005-070075 A    3/2005
(Continued)

OTHER PUBLICATIONS

The extended European search report issued by the European Patent Office dated Jan. 3, 2018, which corresponds to European Patent Application No. 16768395.2-1914 and is related to U.S. Appl. No. 15/712,265.

(Continued)

*Primary Examiner* — Michael Lebentritt
(74) *Attorney, Agent, or Firm* — Studebaker & Brackett PC

(57) ABSTRACT

In a matrix device having two or more systems of electrode groups such as X and Y systems, the one or more electrode groups are grouped into groups each consisting of a plurality of pixel electrodes, connection wires are branched off and connected to the pixel electrodes so that the same signal is not supplied to the pixel electrodes of the same group but the same signal is supplied to one pixel electrode of two or more groups, switching elements are provided corresponding to the individual pixel electrodes, and a gate electrode and a gate insulating film of the switching elements are used in common in the same group. Accordingly, in the matrix device and manufacturing of the matrix device, the number of connection wires and driver ICs is reduced.

4 Claims, 9 Drawing Sheets

(51) Int. Cl.
*G02F 1/1368* (2006.01)
*G09F 9/00* (2006.01)
*G09F 9/30* (2006.01)
*G09G 3/20* (2006.01)
*H01L 27/28* (2006.01)
*G09G 3/3208* (2016.01)
*G09G 3/36* (2006.01)

(52) U.S. Cl.
CPC ............... *G09F 9/00* (2013.01); *G09F 9/30* (2013.01); *G09G 3/20* (2013.01); *H01L 27/1262* (2013.01); *H01L 27/283* (2013.01); *G09G 3/2092* (2013.01); *G09G 3/3208* (2013.01); *G09G 3/3611* (2013.01); *G09G 2300/0404* (2013.01); *G09G 2300/0426* (2013.01); *G09G 2310/0205* (2013.01); *G09G 2310/0218* (2013.01); *G09G 2310/0297* (2013.01)

(56) References Cited

U.S. PATENT DOCUMENTS

| | | | | |
|---|---|---|---|---|
| 6,624,857 | B1* | 9/2003 | Nagata | G02F 1/1309 349/139 |
| 7,619,698 | B2* | 11/2009 | Shimomaki | G02F 1/134363 349/41 |
| 2003/0147021 | A1* | 8/2003 | Ohta | G02F 1/134363 349/43 |
| 2004/0032554 | A1* | 2/2004 | Yoon | G02F 1/133555 349/113 |
| 2004/0159835 | A1* | 8/2004 | Krieger | B82Y 10/00 257/40 |
| 2005/0078240 | A1 | 4/2005 | Murade | |
| 2005/0083466 | A1* | 4/2005 | Lee | G02F 1/134363 349/141 |
| 2006/0139541 | A1* | 6/2006 | Yamaguchi | G02F 1/133707 349/130 |
| 2006/0208658 | A1 | 9/2006 | Kim | |
| 2006/0262050 | A1 | 11/2006 | Ogawa et al. | |
| 2007/0159570 | A1* | 7/2007 | Nagasawa | G02F 1/1345 349/54 |
| 2008/0049156 | A1* | 2/2008 | Kim | G02F 1/136286 349/40 |
| 2009/0213054 | A1 | 8/2009 | Masui | |
| 2009/0289882 | A1 | 11/2009 | Masui | |
| 2009/0321725 | A1 | 12/2009 | Yoshida et al. | |
| 2010/0053058 | A1* | 3/2010 | Nagashima | G09G 3/36 345/98 |
| 2011/0175670 | A1 | 7/2011 | Shishido | |
| 2012/0162559 | A1* | 6/2012 | Kim | G02F 1/134363 349/42 |
| 2012/0268703 | A1* | 10/2012 | Funakoshi | G02F 1/134363 349/139 |
| 2015/0301420 | A1* | 10/2015 | Yoshida | G02F 1/1345 257/43 |
| 2017/0371199 | A1* | 12/2017 | Maede | G02B 5/201 |

FOREIGN PATENT DOCUMENTS

| | | |
|---|---|---|
| JP | 2005-077636 A | 3/2005 |
| JP | 2006-308860 A | 11/2006 |
| JP | 2007-086653 A | 4/2007 |
| JP | 2009-198874 A | 9/2009 |
| JP | 2009-540623 A | 11/2009 |
| JP | 2010-102216 A | 5/2010 |
| JP | 2010-278116 A | 12/2010 |
| JP | 2013-207071 A | 10/2013 |

OTHER PUBLICATIONS

An Office Action mailed by the Japanese Patent Office dated Jul. 24, 2018, which corresponds to Japanese Patent Application No. 2017-508176 and is related to U.S. Appl. No. 15/712,265.
International Search Report issued in PCT/JP2016/057083; dated May 31, 2016.
Written Opinion of the International Searching Authority issued in PCT/JP2016/057083; dated May 31, 2016.
Communication pursuant to Article 94(3) EPC issued by the European Patent Office dated Dec. 14, 2018, which corresponds to European Patent Application No. 16768395.2-1210 and is related to U.S. Appl. No. 15/712,265.
An Office Action mailed by the Japanese Patent Office dated Oct. 23, 2018, which corresponds to Japanese Patent Application No. 2017-508176 and is related to U.S. Appl. No. 15/712,265.
An Office Action, "Decision to Decline the Amendment", mailed by the Japanese Patent Office dated Mar. 19, 2019, which corresponds to Japanese Patent Application No. 2017-508176 and is related to U.S. Appl. No. 15/712,265.
An Office Action, "Decision of Refusal", mailed by the Japanese Patent Office dated Mar. 19, 2019, which corresponds to Japanese Patent Application No. 2017-508176 and is related to U.S. Appl. No. 15/712,265.

* cited by examiner

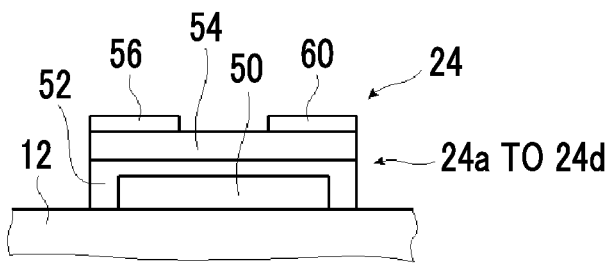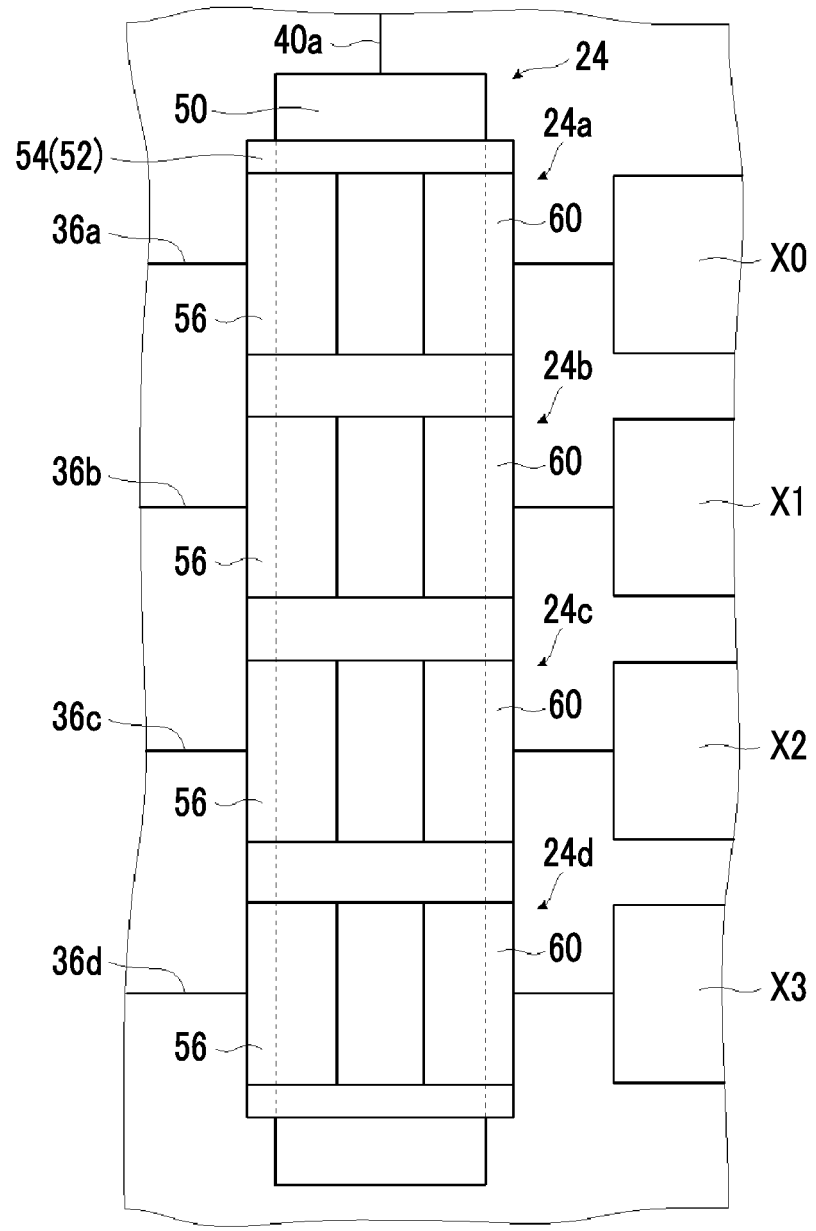

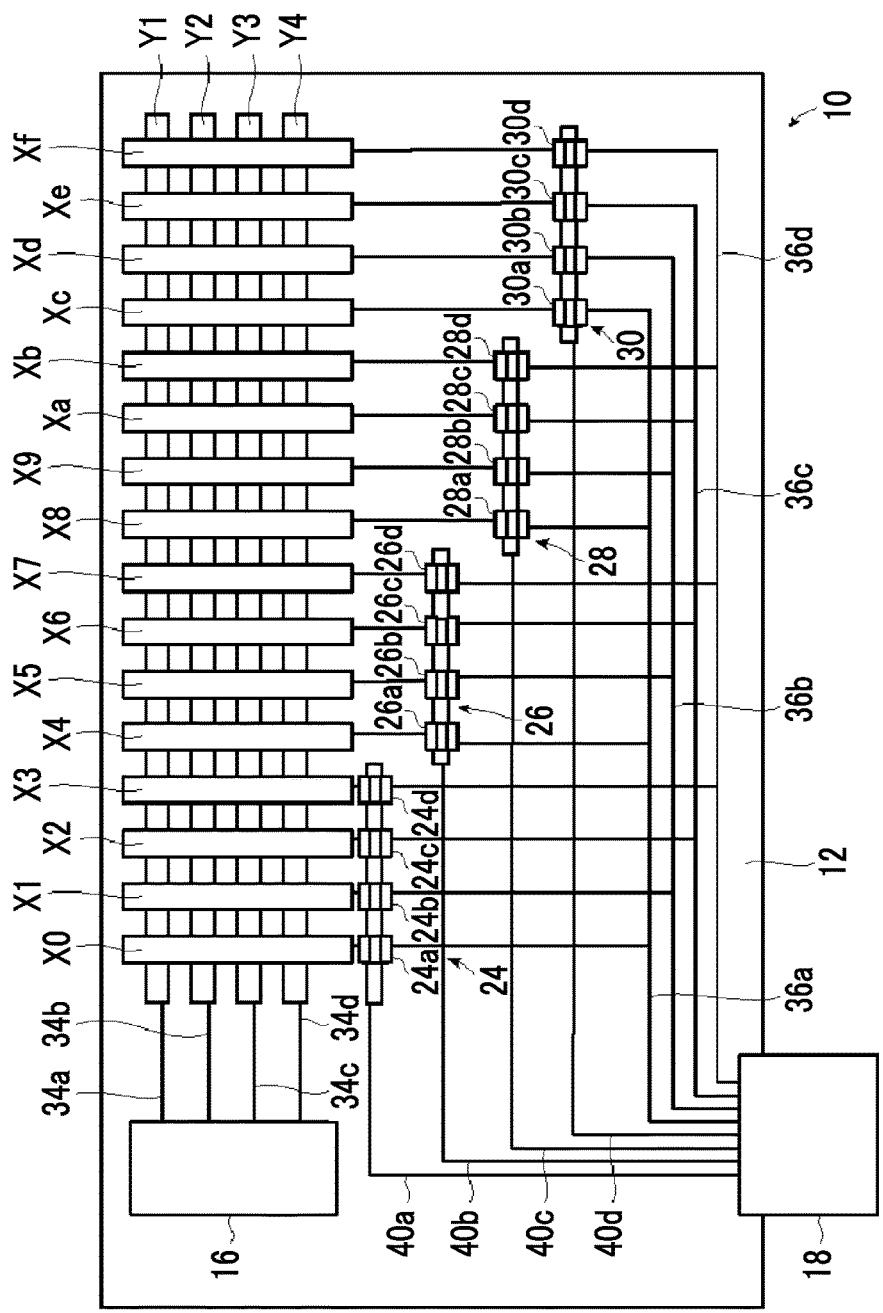

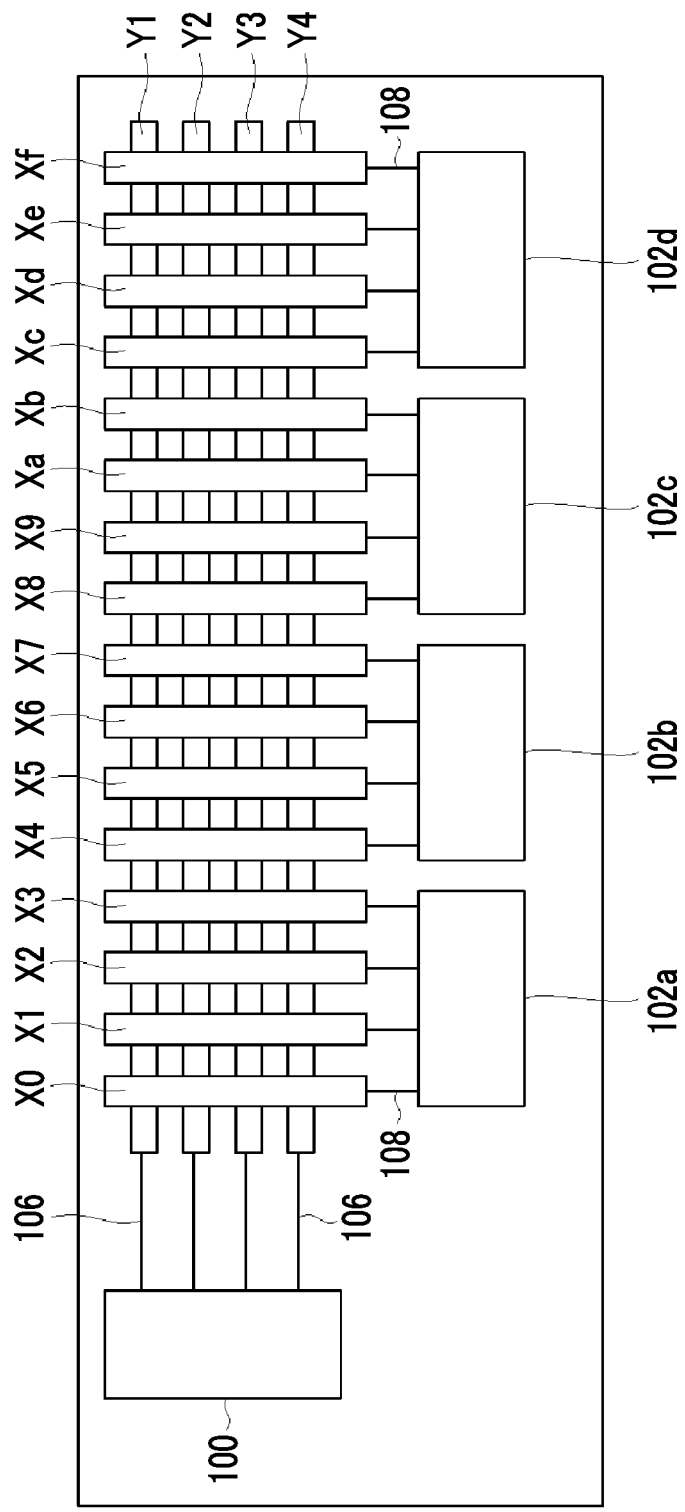

MATRIX DEVICE AND MANUFACTURING METHOD OF MATRIX DEVICE

CROSS-REFERENCE TO RELATED APPLICATIONS

This application is a Continuation of PCT International Application No. PCT/JP2016/057083 filed on Mar. 8, 2016, which claims priority under 35 U.S.C. § 119(a) to Japanese Patent Application No. 2015-064349 filed on Mar. 26, 2015. The above application is hereby expressly incorporated by reference, in its entirety, into the present application.

BACKGROUND OF THE INVENTION

1. Field of the Invention

The present invention relates to a matrix device used in various display devices such as liquid crystal displays and various sensors such as touch panels. More specifically, the present invention relates to a matrix device in which wiring for driving each electrode is simplified, and a manufacturing method of the matrix device.

2. Description of the Related Art

A matrix device which performs matrix scanning is used in display devices such as liquid crystal displays (LCDs), organic electroluminescence displays (organic EL displays), and electronic papers and sensors such as touch panels.

As described in JP2005-70075A, JP2005-77636A, JP2010-102216A, and the like, a matrix device representatively includes a large number of pixel electrodes elongated in an X direction and a large number of pixel electrodes elongated in a Y direction orthogonal to the X direction and displays an image or the like by supplying a signal (driving power) to each pixel electrode.

In the matrix device, the intersection between the pixel electrodes is a pixel, and a planar, that is, two-dimensional image as a whole can be displayed.

FIG. 8 conceptually illustrates an example of a matrix device.

The matrix device illustrated in FIG. 8 includes four pixel electrodes Y1 to Y4 elongated in a horizontal direction in the figure and 16 pixel electrodes X0 to Xf elongated in a direction orthogonal to the pixel electrodes Y1 to Y4.

Signals are supplied to the pixel electrodes Y1 to Y4 by a Y driver IC 100. On the other hand, in the pixel electrodes X0 to Xf, signals are supplied to the pixel electrodes X0 to X3, the pixel electrodes X4 to X7, the pixel electrodes X8 to Xb, and the pixel electrodes Xc to Xf by an X driver IC 102*a*, an X driver IC 102*b*, an X driver IC 102*c*, and X driver IC 102*d*, respectively.

In addition, the pixel electrodes Y1 to Y4 and the pixel electrodes X0 to Xf are connected to the corresponding driver IC via selection wires 106 and connection wires 108, respectively.

In order to cause pixels on the pixel electrode Y1 to perform display, the Y driver IC 100 supplies a signal for selecting the pixels only to the pixel electrode Y1. Simultaneously, the X driver ICs 102*a* to 102*d* supply ON and OFF signals corresponding to the pixels performing display to the pixel electrodes X0 to Xf.

For example, the pixel at the intersection of the pixel electrode Y1 and pixel electrode X0 is turned on and off according to the signal supplied to the pixel electrode X0. In addition, gradation display can be performed by supplying an analog voltage value to the pixel electrode X0 and thus, allowing the corresponding pixel to perform display with brightness corresponding to the voltage.

The signals supplied to the pixel electrodes X0 to Xf are also supplied to the intersections with the pixel electrodes Y2 to Y4 in addition to the pixel electrode Y1. However, no signal is supplied from the Y driver IC 100 to the pixel electrodes Y2 to Y4, and thus, pixels on the pixel electrodes Y2 to Y4 do not perform display.

Next, the Y driver IC 100 supplies a selection signal only to the pixel electrode Y2, and the X driver ICs 102*a* to 102*d* supply signals to the pixels on the pixel electrodes X0 to Xf corresponding to the contents to be displayed on the pixel electrode Y2.

Hereinafter, by sequentially performing similar operations on the pixel electrodes Y3 and Y4, it is possible to finally perform display on the pixels of the entire display.

SUMMARY OF THE INVENTION

In FIG. 8, in order to simplify the figure and provide a clear description, the four Y-system pixel electrodes Y1 to Y4 and the 16 X-system pixel electrodes X0 to Xf are included is illustrated.

However, in an actual LCD or the like, a screen is composed of tens to hundreds of pixel electrodes to display a high-definition image. For example, in a case of 640×480 pixels, called VGA display, a total of 1120 pixel electrodes including 480 Y-system pixel electrodes and 640 X-system pixel electrodes are included.

A signal for displaying an image is supplied by an LSI. However, wiring and mounting of 1120 connection wires from the LSI is difficult, and due to an increase in the LSI area, costs are increased.

Therefore, it is general that signals are supplied from an LSI that forms a signal via a small number of connection wires and as illustrated in FIG. 8, the signals are converted into parallel signals by a driver IC on a matrix substrate and are supplied to pixel electrodes. The driver IC can supply a plurality of signals through 64 channels, 128 channels, or 256 channels, and the connection wires are connected to the pixel electrodes on the matrix substrate by the number of such channels.

That is, in the matrix device in the related art, although the number of signal lines from the LSI is small, for example, regarding VGA display, 1120 connection wires are finally formed on the substrate. Such mounting has a high level of difficulty. In addition, in a case where the number of pixels, that is, the number of pixel electrodes increases, the level of difficulty of the mounting further increases, and the number of driver ICs also increases.

It is also possible to supply signals to 640 pixel electrodes from a single driver IC. However, for the same reason as the mounting of the LSI, the level of difficulty of the mounting increases, or the area of the driver IC increases. Therefore, from the viewpoint of costs, a plurality of driver ICs are generally used. Furthermore, even in a case where a driver IC capable of supplying signals to 640 pixel electrodes is used, the number of wires to be mounted is the same, and the level of difficulty of the mounting also becomes higher.

On the other hand, as described in JP2005-77636A and JP2010-102216A, for example, the number of connection wires can be reduced by branching off connection wires for supplying a signal to each pixel electrode in an X-system and providing switching elements such as transistors corresponding to the individual pixel electrodes.

However, even in this method, the connection wires are necessary for the individual switching elements (gate electrodes). For this reason and the like, the number of connection wires cannot be sufficiently reduced and mounting cannot be simplified.

An object of the present invention is to solve such a problem of the related art, and is to provide a matrix device which performs image display or sensing through matrix scanning using pixel electrodes which are elongated in XY directions orthogonal to each other, in which the number of wires connected to the pixel electrodes and the number of driver ICs supplying signals to the pixel electrodes can be reduced and manufacturing simplification can be achieved, and a manufacturing method of the matrix device.

In order to attain the object, there is provided a matrix device of the present invention comprising: at least two systems of electrode groups each consisting of a plurality of pixel electrodes that are elongated and do not intersect each other, the pixel electrodes of the electrode group of one system intersecting those of the other system, in which the electrode group of at least one system is grouped into a plurality of groups each consisting of a plurality of the pixel electrodes, the matrix device includes branched wires connected to the pixel electrodes of the system divided into the plurality of groups so that the same signal is not supplied to the pixel electrodes of the same group but the same signal is supplied to one pixel electrode of each group, and switching elements using a semiconductor which are provided corresponding to the individual pixel electrodes of the system divided into the plurality of groups, and a gate electrode and a gate insulating film of the switching elements are common to the switching elements corresponding to the pixel electrodes of the same group.

In the matrix device of the present invention, it is preferable that the gate electrode of the switching elements and the pixel electrodes of the electrode group of the system different from that of the electrode group corresponding to the switching elements are formed of the same material.

In addition, it is preferable that the gate electrode of the switching elements and wires connected to the pixel electrodes of the electrode group of the system different from that of the electrode group corresponding to the switching elements are formed of the same material.

In addition, it is preferable that the gate electrode of the switching elements and a wire connected to the gate electrode are formed of the same material.

In addition, it is preferable that the switching elements are formed on a substrate on which the electrode groups are formed.

Furthermore, it is preferable that the matrix device further comprises a logic circuit provided on the wire connected to the gate electrode.

In addition, there is provided a manufacturing method of a matrix device of the present invention comprising: in a case where a matrix device which includes at least two systems of electrode groups, each consisting of a plurality of pixel electrodes that are elongated and do not intersect each other and is formed by intersecting the pixel electrodes of the electrode groups of the respective systems is manufactured, the matrix device having the electrode group of at least one system being grouped into a plurality of groups each consisting of a plurality of the pixel electrodes, and switching elements provided corresponding to the individual pixel electrodes of the electrode group that is grouped, a gate forming step of forming a gate electrode common to all the switching elements corresponding to the individual pixel electrodes of the same group; an insulating film forming step of forming a gate insulating film common to all the switching elements corresponding to the individual pixel electrodes of the same group; and a source/drain forming step of forming a source electrode and a drain electrode forming each of the switching elements corresponding to the individual pixel electrodes of the same group.

In the manufacturing method of a matrix device of the present invention, it is preferable that in the gate forming step, simultaneously with the forming of the gate electrode, the pixel electrodes of the electrode group of the system different from that of the electrode group corresponding to the gate electrode are formed.

In addition, it is preferable that in the gate forming step, simultaneously with the forming of the gate electrode, wires connected to the pixel electrodes of the electrode group of the system different from that of the electrode group corresponding to the gate electrode are formed.

In addition, it is preferable that in the gate forming step, simultaneously with the forming of the gate electrode, a wire connected to the gate electrode is formed.

According to the present invention, in a matrix device which performs image display or sensing through matrix scanning using pixel electrodes which are elongated in XY directions orthogonal to each other, the number of wires connected to the pixel electrodes and the number of driver ICs supplying signals to the pixel electrodes can be reduced and manufacturing simplification can be achieved.

BRIEF DESCRIPTION OF THE DRAWINGS

FIGS. 2A and 2B are conceptual views illustrating a switching element used in the matrix device illustrated in FIG. 1.

FIGS. 6A and 6B are conceptual views illustrating an example of the manufacturing method of a matrix device of the present invention.

FIG. 8 is a view conceptually illustrating a matrix device of the related art.

DESCRIPTION OF THE PREFERRED EMBODIMENTS

Hereinafter, a matrix device and a manufacturing method of a matrix device according to the present invention will be described in detail based on preferred examples illustrated in the accompanying drawings.

Figure 1:
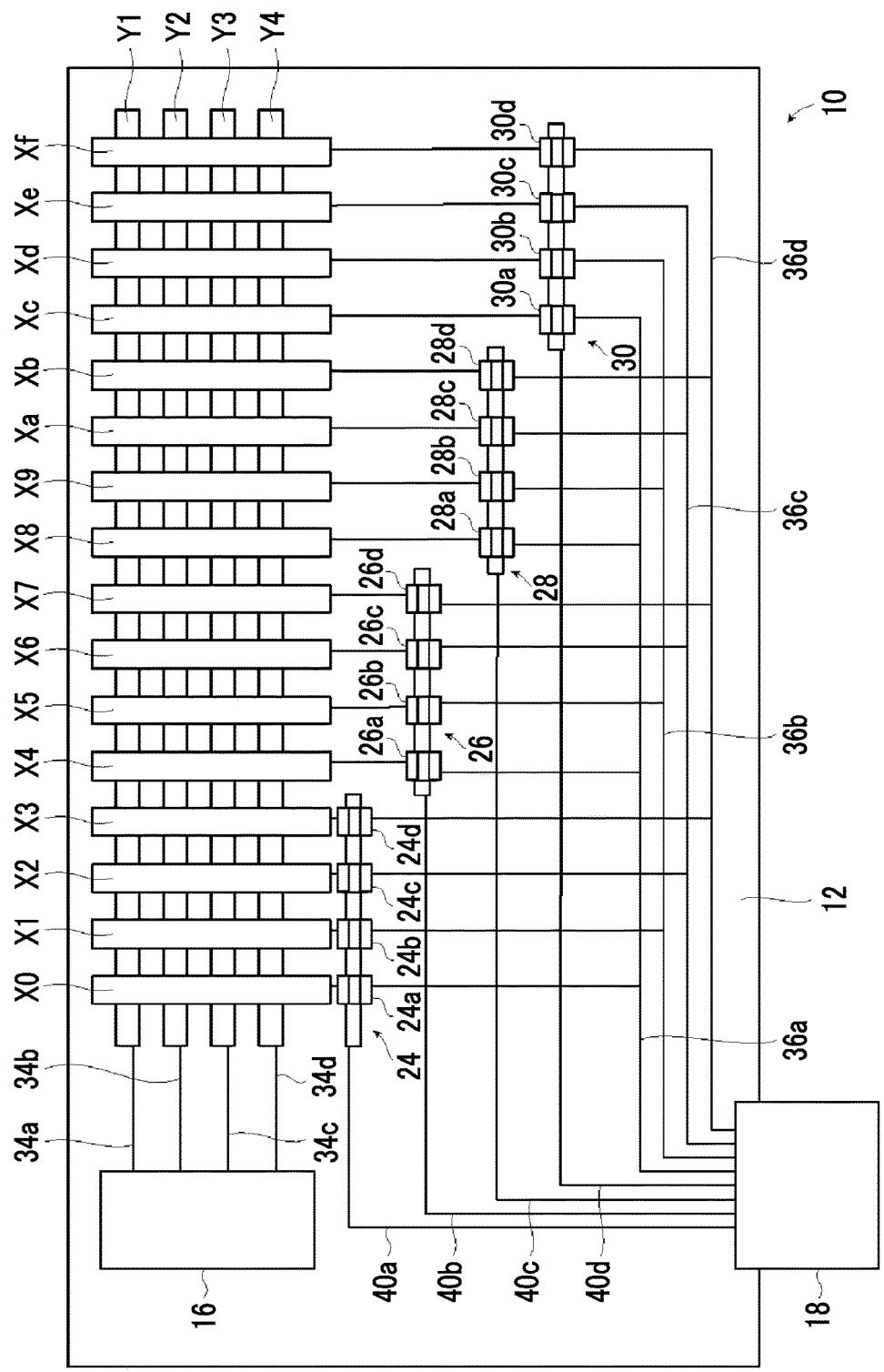
FIG. 1 is a view conceptually illustrating an example of a matrix device of the present invention.

FIG. 1 conceptually illustrates an example of the matrix device of the present invention.

A matrix device 10 illustrated in FIG. 1 basically includes four Y-system pixel electrodes Y1 to Y4, 16 X-system pixel electrodes X0 to Xf, a Y driver IC 16, an X driver IC 18, a first switching element group 24, a second switching element group 26, a third switching element group 28, a fourth switching element group 30, selection wires 34a to 34d which are wires (signal lines) that connect the Y driver IC 16 to the pixel electrodes, connection wires 36a to 36d which are wires that connect the pixel electrodes to the X driver IC 18, and switch wires 40a to 40d which are wires that connect the X driver IC 18 to the corresponding switching element groups.

In addition, the pixel electrode X0 to Xf, the Y driver IC 16, the first switching element group 24, the second switching element group 26, the third switching element group 28, the fourth switching element group 30, the selection wires 34a to 34d, the connection wires 36a to 36d, and the switch wires 40a to 40d are formed on a substrate 12.

The substrate 12 is a known substrate (matrix substrate) used in a matrix device which performs image display or sensing through matrix scanning (active matrix).

Therefore, the thickness, size in the surface direction, forming material, and the like thereof may be appropriately set according to the size of the matrix device, the number of pixels, and the like.

The pixel electrodes Y1 to Y4 are electrodes that are elongated in one direction and do not intersect each other. The pixel electrodes X1 to Xf are electrodes that are elongated in a direction orthogonal to the pixel electrodes Y1 to Y4 and do not intersect each other.

As illustrated in FIG. 1, the pixel electrodes Y1 to Y4 and the pixel electrodes X1 to Xf are disposed so as to intersect all the other pixel electrodes in the surface direction of the substrate 12. That is, the matrix device 10 is a matrix device which performs a so-called XY scanning, that is, which has electrode groups of two systems including an X-system electrode group and a Y-system electrode group intersecting each other.

In addition, in the matrix device 10 illustrated in FIG. 1, the pixel electrodes are linear, and the X-system pixel electrodes and the Y-system pixel electrodes are orthogonal to each other. However, the pixel electrodes may also be curved, and the X-system pixel electrodes and the Y-system pixel electrodes may intersect each other in a state other than the orthogonal state. This is also applied to other matrix devices.

Both the pixel electrodes Y1 to Y4 and the pixel electrodes X0 to Xf are known pixel electrodes (scanning lines) provided in a matrix device which performs matrix scanning.

Therefore, as the forming material, various known materials used as the pixel electrode of a matrix device including metals such as gold, silver, copper, aluminum, chromium, nickel, titanium, tantalum, tungsten, and cobalt alloys of such metals, transparent electrodes such as indium tin oxide (ITO), tin oxide, indium oxide, and zinc oxide, and the like can be used.

The width, thickness, length, and the like of the pixel electrode may be appropriately set according to the size of the matrix device 10 and the number of pixels.

Here, the X-system pixel electrodes X0 to Xf are grouped into four groups each including four pixel electrodes. That is, the pixel electrodes X0 to Xf are grouped into four groups including a first group consisting of the pixel electrodes X1 to X3, a second group consisting of the pixel electrodes X4 to X7, a third group consisting of the pixel electrodes X8 to Xb, and a fourth group consisting of the pixel electrodes Xc to Xf.

In addition, as a preferred embodiment, the pixel electrodes Y1 to Y4 are formed of the same material as a gate electrode 50 of a switching element, which will be described later (see FIGS. 2A and 2B).

The above points will be described later in detail.

Although the matrix device illustrated in FIG. 1 has the four pixel electrodes Y1 to Y4 and the 16 pixel electrodes X1 to Xf in a device that performs XY scanning, the present invention is not limited thereto, and the number of X-system pixel electrodes and the number of Y-system pixel electrodes may vary.

For example, as in the matrix device which performs VGA display, a total of 1120 pixel electrodes including 480 Y-system pixel electrodes and 640 X-system pixel electrodes may be included.

The Y driver IC 16 and the X driver IC 18 are known driver ICs used in the matrix device that performs matrix scanning. The Y driver IC 16 and the X driver IC 18 are preferably driver ICs which use an inorganic semiconductor such as Si, GaN, or SiC, and more preferably driver ICs using Si.

In the example illustrated in FIG. 1, the Y driver IC 16 is a 4-ch driver IC, and the X driver IC 18 is an 8-ch driver IC. However, the present invention is not limited thereto. For example, the Y driver IC 16 and the X driver IC 18 may be 64-ch, 128-ch, or 256-ch driver ICs or the like.

In addition, the signals supplied by the driver IC include not only signals for supplying scanning signals in a serial form or parallel form but also a power source, a GND, and the like. Preferably, the signals are in the parallel form and include the power source and the GND.

The pixel electrodes Y1 to Y4 are connected to the Y driver IC 16 via the selection wires 34a to 34d to be supplied with signals (driving power) from the Y driver IC 16.

As a preferred embodiment, the selection wires 34a to 34d are formed of the same material as the gate electrode 50 of the switching element, which will be described later (see FIGS. 2A and 2B).

On the other hand, the pixel electrodes X0 to Xf are connected to the X driver IC 18 via the four connection wires 36a to 36d to be supplied with signals from the X driver IC 18.

The connection wires 36a to 36d are branched off so that the same signal is not supplied to the pixel electrodes of the same group but the same signal is supplied to one pixel electrode of each group and are connected to the pixel electrodes X0 to Xf.

That is, as described above, the pixel electrodes X0 to Xf are divided into the first group consisting of pixel electrodes X1 to X3, the second group consisting of the pixel electrodes X4 to X7, the third group consisting of the pixel electrodes X8 to Xb, and the fourth group consisting of the pixel electrodes Xc to Xf.

As illustrated in FIG. 1, the connection wire 36a is branched off into four wires connected to the pixel electrode X0 of the first group, the pixel electrode X4 of the second group, the pixel electrode X8 of the third group, and the pixel electrode Xc of the fourth group.

The connection wire 36b is branched off into four wires connected to the pixel electrode X1 of the first group, the pixel electrode X5 of the second group, the pixel electrode X9 of the third group, and the pixel electrode Xd of the fourth group.

The connection wire 36c is branched off into four wires connected to the pixel electrode X2 of the first group, the pixel electrode X6 of the second group, the pixel electrode Xa of the third group, and the pixel electrode Xe of the fourth group.

Furthermore, the connection wire 36d is branched off into four wires connected to the pixel electrode X3 of the first group, the pixel electrode X7 of the second group, the pixel electrode Xb of the third group, and the pixel electrode Xf of the fourth group.

In the matrix device 10 of the present invention, switching elements are provided corresponding to the individual pixel electrodes X0 to Xf which are grouped.

Specifically, switching elements 24a to 24d are provided corresponding to the pixel electrodes X0 to X3 of the first group, and constitute the first switching element group 24. Switching elements 26a to 26d are provided corresponding to the pixel electrodes X4 to X7 of the second group, and constitute the second switching element group 26. Switching elements 28a to 28d are provided corresponding to the pixel electrodes X8 to Xb of the third group and constitute the third switching element group 28. Furthermore, switching elements 30a to 30d are provided corresponding to the pixel electrodes Xc to Xf of the fourth group, and constitute the fourth switching element group 30.

As will be described later, in the matrix device 10 of the present invention, the switching element is a switching element using a semiconductor. In addition, the switching elements of one switching element group, that is, the switching elements corresponding to one group of the pixel electrodes have the gate electrode 50 and a gate insulating film 52 in common.

The gate electrode 50 of the switching elements of the first switching element group 24 is connected to the X driver IC 18 via the switch wire 40a. The gate electrode 50 of the switching elements of the second switching element group 26 is connected to the X driver IC 18 via the switch wire 40b. The gate electrode 50 of the switching elements of the third switching element group 28 is connected to the X driver IC 18 via the switch wire 40c. Furthermore, the gate electrode 50 of the switching elements of the fourth switching element group 30 is connected to the X driver IC 18 via the switch wire 40d (see FIGS. 2A, 2B, and 5B).

In the illustrated example, as a preferred embodiment, the switch wires 40a to 40d are formed of the same material as the gate electrode 50.

In the example illustrated in FIG. 1, the first to fourth switching element groups 24 to 30 are arranged stepwise in the horizontal direction. However, the present invention is not limited thereto, and various configurations can be used. For example, the first to fourth switching element groups 24 to 30 may be linearly arranged in the horizontal direction in the figure.

FIGS. 2A and 2B are conceptual views of the first switching element group 24. The configurations of the second to fourth switching element groups 26 to 30 are the same as that of the first switching element group 24.

FIG. 2A is a view of the first switching element group 24 as seen from the horizontal direction of FIG. 1. FIG. 2B is a view of the first switching element group 24 as seen from the same direction as in FIG. 1.

As illustrated in FIGS. 2A and 2B, the switching elements 24a to 24d are configured to include the gate electrode 50, the gate insulating film 52 covering the gate electrode 50, a semiconductor layer 54 formed on the gate insulating film 52, and a source electrode 56 and a drain electrode 60 formed on the semiconductor layer 54.

The connection wires 36a to 36d are respectively connected to the source electrodes 56 and the drain electrodes 60 of the switching elements 24a to 24d, and the switch wire 40a is connected to the gate electrode 50.

As illustrated in FIG. 2B, in the first switching element group 24, the gate electrode 50 and the gate insulating film 52 are shared by the four switching elements 24a to 24d respectively corresponding to the pixel electrodes X0 to X3 of the first group.

In the present invention, the gate electrode 50, the source electrode 56, and the drain electrode 60 may be formed of various materials used in a semiconductor element such as a thin-film transistor, including metals such as silver, gold, aluminum, copper, platinum, lead, zinc, tin, and chromium, alloys, transparent conductive oxides (TCO) such as indium tin oxide, conductive polymers such as polyethylene dioxythiophene-polystyrene sulfonate (PEDOT-PSS), and laminated structures thereof.

The gate insulating film 52 may also be formed of various materials used in a semiconductor element, including synthetic resins such as polyethylene or polyvinyl chloride, organic insulators such as natural rubber, and metal oxides such as silicon oxide, magnesium oxide, and aluminum oxide.

The semiconductor layer 54 is a layer made of a semiconductor.

As the semiconductor layer 54, a layer made of various semiconductors can be used, and particularly, a layer made of a semiconductor capable of forming a thin semiconductor layer is suitably used. Therefore, as the semiconductor, various semiconductors including various inorganic semiconductors such as simple substances such as silicon, germanium, gallium, indium, and zinc and compounds containing these substances, and organic semiconductors which will be described later. In addition, the semiconductor may be an n-type or p-type semiconductor, or may also be a type other than the n-type and p-type, such as a pn type or p-i-n type.

In addition, regarding a forming method of the semiconductor layer 54, the semiconductor layer 54 according to various known forming methods, such as an organic semiconductor layer formed by a coating method, an inorganic semiconductor layer formed by a coating method, an organic semiconductor layer formed by vapor deposition, an inorganic semiconductor layer formed by a vacuum film forming method such as vacuum deposition, or the like can also be used.

Particularly, a coating type semiconductor with which the semiconductor layer 54 with good crystallinity can be formed, and a thin-film semiconductor layer 54 can be easily formed by a coating method is suitable from the viewpoint of manufacturing simplification. Furthermore, an organic semiconductor is suitably used because the organic semiconductor can be formed on a low heat resistant substrate such as film at a low temperature and has flexibility.

In the matrix device of the present invention, since the switching elements using the semiconductor layer 54 are included, the gate electrode and the gate insulating film are shared by a plurality of the switching elements, and thus the number of wires or driver ICs is reduced.

In the present invention, as the organic semiconductor, various known materials used in an organic semiconductor layer in an organic semiconductor element can be used. Therefore, the organic semiconductor may be an n-type or p-type semiconductor, or may also be a type other than the n-type and p-type, such as a pn type or p-i-n type. Particularly, the p-type organic semiconductor is suitably used.

Examples of the organic semiconductor include pentacene derivatives such as 6,13-bis(triisopropylsilylethynyl) pentacene (TIPS pentacene), anthradithiophene derivatives such as 5,11-bis(triethylsilylethynyl)anthradithiophene (TES-ADT), benzodithiophene (BDT) derivatives, benzothienobenzothiophene (BTBT) derivatives such as dioctylbenzothienobenzothiophene (C8-BTBT), dinaphthothienothiophene (DNTT) derivatives, dinaphthobenzodithiophene (DNBDT) derivatives, 6,12-dioxaanthanthrene(perixanthenoxanthene) derivatives, naphthalenetetracarboxdiimide (NTCDI) derivatives, perylenetetracarboxdiimide (PTCDI) derivatives, polythiophene derivatives, poly(2,5-bis(3-thiophen-2-yl)thieno[3,2-b]thiophene) (PBTTT) derivatives, tetracyanoquinodimethane (TCNQ) derivatives, oligothiophenes, phthalocyanines, fullerenes, and the like.

In the matrix device 10 of the present invention, the shapes, sizes, thicknesses, and the like of the gate electrode 50, the gate insulating film 52, the semiconductor layer 54, the source electrode 56, the drain electrode 60, and the like may be appropriately set according to the size of the matrix device and the number of pixels.

The switching element illustrated in FIGS. 2A and 2B is a bottom gate-top contact switching element (thin-film transistor), but the present invention is not limited thereto.

That is, in the matrix device of the present invention, the switching element is able to use any structure of bottom gate-bottom contact type, top gate-top contact type, and top gate-bottom contact type as long as a semiconductor is used.

Particularly, a bottom gate type switching element is suitably used because one or more of the gate electrodes, the pixel electrodes Y1 to Y4, the selection wires 34a to 34d, and switch wires 40a to 40d can be simultaneously formed on the substrate.

Hereinafter, the present invention will be described in more detail by describing the operation of the matrix device illustrated in FIG. 1.

As described above, in the matrix device 10, the pixel electrodes X0 to Xf are grouped into the first to fourth groups each including four pixel electrodes, and the connection wires 36a to 36d are branched off and the connection wires 36a to 36d are connected so that the same signal is not supplied to the pixel electrodes of the same group but the same signal is supplied to one pixel electrode of each group.

Further, in the matrix device 10, the switching elements are provided corresponding to the individual pixel electrodes X0 to Xf, and only in a case where the switching elements are turned on, signals are supplied to the corresponding pixel electrodes. Furthermore, the switching elements of the same switching element group have the gate electrode 50 in common. That is, in a case where a signal is supplied to the gate electrode 50, the gate electrode of all the switching elements of the switching element group is turned on.

Assuming that the matrix device is a device for driving a display device such as an LCD, in order to display an image, for example, the Y driver IC 16 supplies a signal only to the pixel electrode Y1 through the selection wire 34a in order to initially display an image on a pixel on the pixel electrode Y1.

Simultaneously, for example, the X driver IC 18 supplies a signal only to the connection wire 36a. Accordingly, the pixel electrodes X0, X4, X8, and Xc enter a state capable of being supplied with the signal.

Next, the X driver IC 18 supplies the signal to the switch wire corresponding to the gate electrode 50 of the switching element group connected to the pixel electrode corresponding to the display pixel on the pixel electrode Y1, among the pixel electrodes X0, X4, X8, and Xc.

For example, in a case of allowing a pixel at the intersection of the pixel electrode Y1 and the pixel electrode X0 to perform display, the X driver IC 18 supplies a signal to the gate electrode 50 of the first switching element group 24 via the switch wire 40a. At this time, although the signal is supplied to the gate electrode 50 of all the switching elements 24a to 24d of the first switching element group 24, since no signal is supplied to the connection wires 36b to 36d, only the switching element 24a is turned on. In addition, although the signal is also supplied to the intersections between the pixel electrode X0 and the pixel electrodes Y2 to Y4, since no signal is supplied to the pixel electrodes Y2 to Y4 from the Y driver IC 16, pixels on the pixel electrodes Y2 to Y4 do not perform display.

On the other hand, in a case of allowing a pixel at the intersection of the pixel electrode Y1 and the pixel electrode X8 to perform display, the X driver IC 18 supplies a signal to the gate electrode 50 of the third switching element group 28 via the switch wire 40c. Similarly, at this time, although the signal is supplied to the gate electrode 50 of all the switching elements 28a to 28d of the third switching element group 28, since no signal is supplied to the connection wires 36b to 36d, only the switching element 28a is turned on. In addition, although the signal is also supplied to the intersections between the pixel electrode X8 and the pixel electrodes Y2 to Y4, since no signal is supplied to the pixel electrodes Y2 to Y4 from the Y driver IC 16, pixels on the pixel electrodes Y2 to Y4 do not perform display.

Next, the X driver IC 18 supplies a signal only to the connection wire 36b. Accordingly, the pixel electrodes X1, X5, X9, and Xd enter a state capable of being supplied with the signal.

Next, similarly, the signal is supplied to the gate electrode 50 of the switching element group connected to the pixel electrode corresponding to the pixel to perform display on the pixel electrode Y1, among the pixel electrodes X1, X5, X9, and Xd. For example, in a case of allowing a pixel at the intersection of the pixel electrode Y1 and the pixel electrode X4 to perform display, the X driver IC 18 supplies a signal to the gate electrode 50 of the second switching element group 26 via the switch wire 40b. In addition, in a case of allowing a pixel at the intersection of the pixel electrode Y1 and the pixel electrode Xd to perform display, the X driver IC 18 supplies a signal to the gate electrode 50 of the fourth switching element group 30 via the switch wire 40d.

Thereafter, similarly, by supplying a signal only to the connection wire 36c, the signal is supplied to the gate electrode 50 of the switching element group corresponding to the pixel to perform display, among the intersections between the pixel electrode Y1 and the pixel electrodes X2, X6, Xa, and Xe. Next, similarly, by supplying a signal only to the connection wire 36d, the signal is supplied to the gate electrode 50 of the switching element group corresponding to the pixel to perform display, among the intersections between the pixel electrode Y1 and the pixel electrodes X3, X7, Xb, and Xf, and display by the pixel on the pixel electrode Y1 is ended.

Next, the Y driver IC 16 supplies a signal only to the pixel electrode Y2 via the selection wire 34b.

In addition, similarly, by supplying a signal only to the connection wire 36a, the X driver IC 18 supplies the signal to the gate electrode 50 of the switching element group corresponding to the pixel to perform display, among the intersections between the pixel electrode Y2 and the pixel electrodes X0, X4, X8, and Xc. Next, by supplying a signal only to the connection wire 36b, the X driver IC 18 supplies the signal to the gate electrode 50 of the switching element group corresponding to the pixel to perform display, among the intersections between the pixel electrode Y2 and the pixel electrodes X1, X5, X9, and Xd. Furthermore, by also supplying signals to the connection wires 36c and 36d in the same manner, the signals are supplied to the gate electrodes 50 of the switching element groups corresponding to the pixels to perform display, and display of the pixels on the pixel electrode Y2 is ended.

Next, a signal is supplied only to the pixel electrode Y3 via the selection wire 34c and the same operation is performed, and a signal is supplied only to the pixel electrode Y4 via the selection wire 34d and the same operation is performed such that the pixels on the entire surface of the matrix device 10 perform display.

As described above, in the matrix device of the present invention, the pixel electrodes of one system are grouped, and the pixel electrodes and the driver ICs are connected so that the same signal is not supplied to the same group but the same signal is supplied to one pixel electrode of each group via the branched wires, and the switching elements are provided corresponding to the individual pixel electrodes. In addition, by forming the switching elements using the semiconductor, the gate electrode and the insulating film are used by the switching elements corresponding to the pixel electrodes of the same group in common. Accordingly, it is possible to reduce the number of wires and the number of driver ICs, furthermore, it is possible to achieve manufacturing simplification.

In the matrix device 10 of the illustrated example, in the matrix element that performs XY scanning, the X-system pixel electrodes X0 to Xf are grouped into the four groups, and the pixel electrodes X0 to Xf and the X driver IC 18 are connected so that the same signal is not supplied to the same group but the same signal is supplied to one pixel electrode of each group via the four connection wires 36a to 36d which are branched off. In addition, in the matrix device 10, the switching elements using the semiconductor are provided corresponding to the individual pixel electrodes X0 to Xf, and the gate electrode 50 and the gate insulating film 52 are used by the switching elements of the switching element group corresponding to the pixel electrodes of the same group in common.

As described above, in the matrix device of the related art illustrated in FIG. 8, in the case where 16 X-system pixel electrodes X0 to Xf are included, 16 connection wires 108 connected to the driver IC and the pixel electrodes X0 to Xf are necessary.

Contrary to this, in the matrix device 10 of the present invention, with the above-described configuration, for the 16 X-system pixel electrodes X0 to Xf, a total of eight wires including the four connection wires 36a to 36d and the four switch wires 40a to 40d for using the gate electrode 50 and the gate insulating film 52 in common by the switching elements using the semiconductor, display of an image can be perfoinied. In addition, since the number of wires is reduced, the number of driver ICs corresponding to the pixel electrodes can also be reduced. Furthermore, by using the gate electrode 50 by the plurality of switching elements in common, wiring can be simplified.

In the matrix device illustrated in FIG. 1, the number of pixel electrodes is 16 in order to simplify the description. However, as described above, in actual display devices and the like, the number of pixel electrodes (the number of pixels) is much larger.

For example, in one system, in a case where the number of pixel electrodes is 640 and the driver IC is a 160-ch driver IC, in the matrix device of the related art, the number of connection wires corresponding to the pixel electrodes is 640, and four driver ICs are necessary.

Contrary to this, according to the matrix device of the present invention, the pixel electrodes are grouped into four groups each including 160 pixel electrodes and four switching element groups consisting of switching elements which use the gate electrode and the gate insulating film in common are used. Accordingly, a total of 164, that is, a small number of connection wires including the 160 connection wires and the four switch wires and two driver ICs may be used.

In addition, in the matrix device of the present invention, since the switching elements are used, the time needed to display one screen is longer than that of a typical matrix device. In the matrix device 10 of the illustrated example, since four pixel electrodes are grouped as one group, it takes four times longer to display one image surface.

However, by increasing a signal clock by four times, the display can be processed in the same image forming time. Alternatively, in applications such as electronic papers in which the image switching frequency is low, there is no need to increase the signal clock.

In addition, in the matrix device of the present invention, since the pixel electrodes X0 to Xf of which the switching elements are not supplied with signals are in an electrically floating state, image signals may remain due to charges.

Regarding this, the charges can be quickly removed by placing an appropriate resistance between the pixel electrodes X0 to Xf and the pixel electrodes Y1 to Y4 and/or earth electrodes. Alternatively, there may be cases where there is no problem even in a case where an element is not added due to leakage current at the pixels.

Furthermore, in the matrix device 10 illustrated in FIG. 1, the number of wires is reduced by branching off the connection wires connected to the X-system pixel electrodes X0 to Xf and grouping the switching elements using the gate electrode 50 in common. However, the present invention is not limited thereto.

That is, in the present invention, the number of wires can also be reduced by branching off the connection wires connected to the Y-system pixel electrodes corresponding to a selection signal and grouping the switching elements using the gate electrode in common. Furthermore, by branching off the connection wires for both the X-system pixel electrodes and the Y-system pixel electrodes and grouping the switching elements using the gate electrode in common, an advantage that the number of wires can be further reduced can be obtained.

Figure 3:
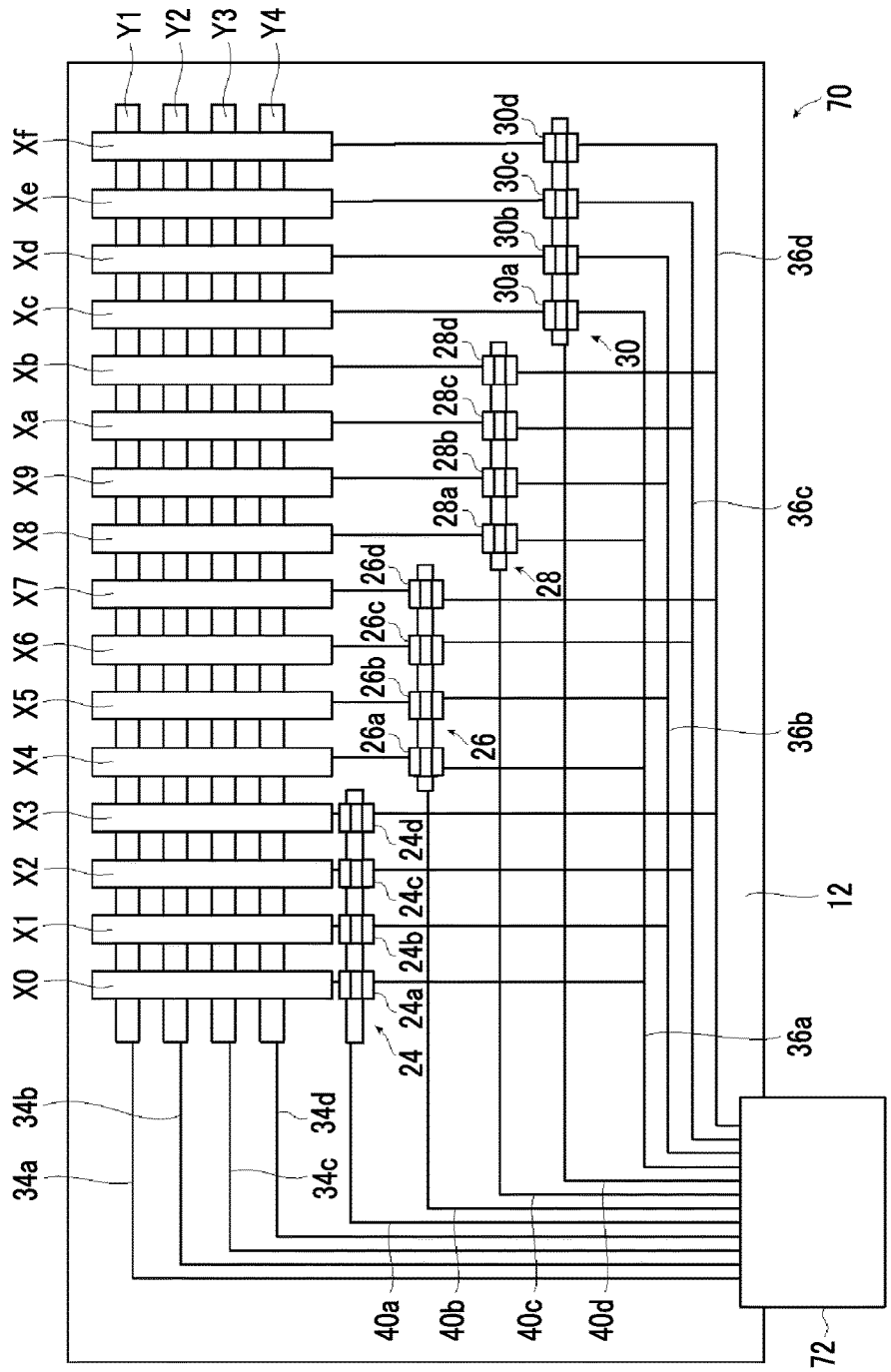
FIG. 3 is a view conceptually illustrating another example of the matrix device of the present invention.

FIG. 3 conceptually illustrates another example of the matrix device of the present invention.

Since a matrix device 70 illustrated in FIG. 3 generally uses the same reference numerals as those of the matrix device 10 illustrated in FIG. 1, like elements are denoted by like reference numerals, and description of different portions will be mainly provided. This is also applied to a matrix device 76 illustrated in FIG. 4, which will be described later.

As described above, according to the present invention, the number of wires of the matrix device can be significantly reduced.

Therefore, like the matrix device 70 illustrated in FIG. 3, it is also possible to drive the pixel electrodes Y1 to Y4 and the pixel electrodes X0 to Xf with one driver IC 72.

Furthermore, by combining the switch wires connected to the gate electrode 50 with a logic circuit, the number of switch wires can be further reduced.

Figure 4:
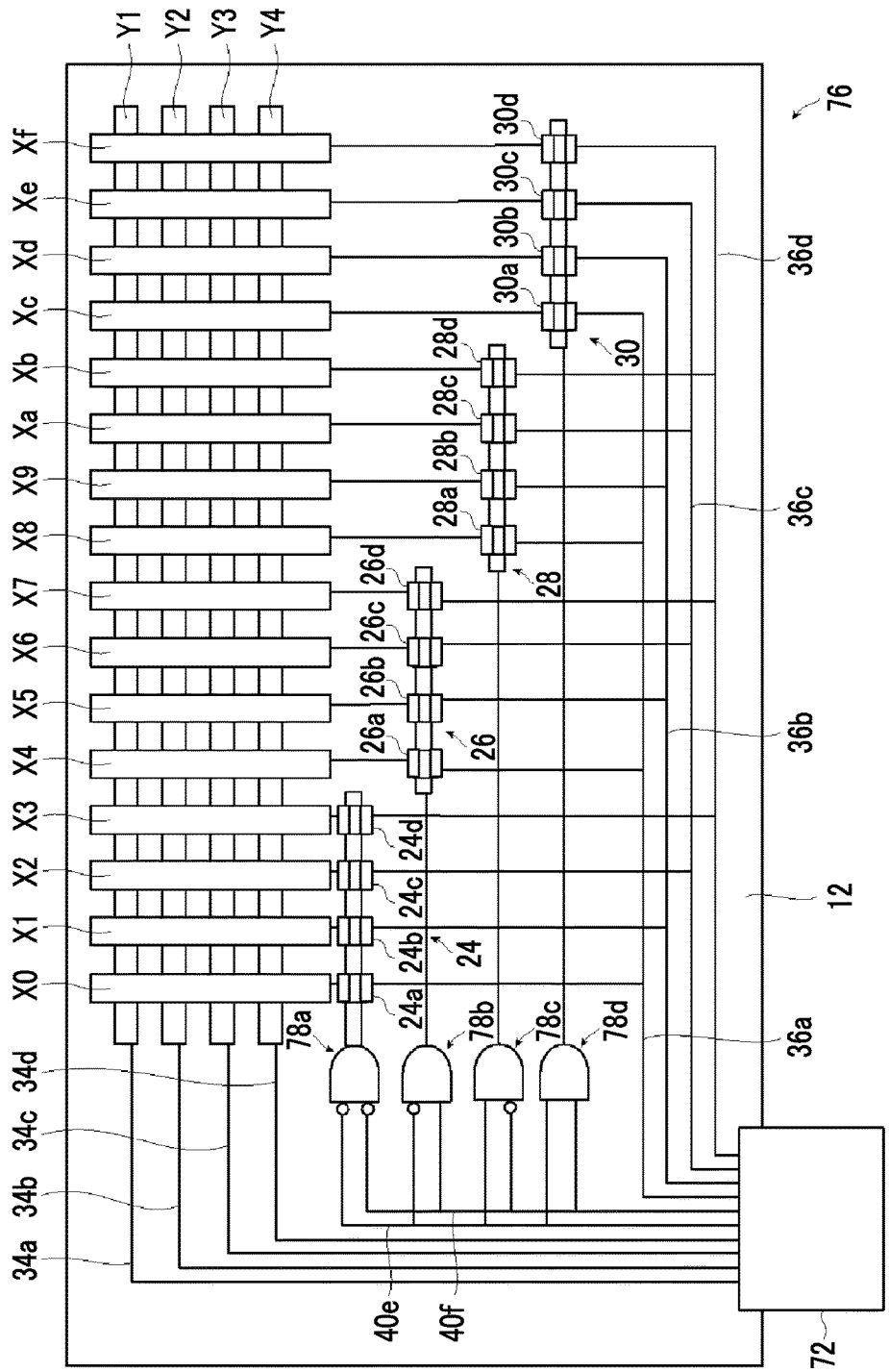
FIG. 4 is a view conceptually illustrating another example of the matrix device of the present invention.

For example, like the matrix device 76 illustrated in FIG. 4, by using a circuit 78a which has a high output in a case where both the inputs are low, a circuit 78b which has a high output in a case where one input is low and the outer input is high, a circuit 78c which has a high output in a case where the low and high inputs are opposite to those of the circuit 78b, and a circuit 78d which has a high output in a case where both the inputs are high, two switch wires 40e and 40f can be used as the switch wires.

Hereinafter, an example of a manufacturing method of a matrix device of the present invention will be described by describing a manufacturing method of the matrix device 10 illustrated in FIG. 1 with reference to the conceptual views of FIGS. 5A to 6B.

Figure 5A:
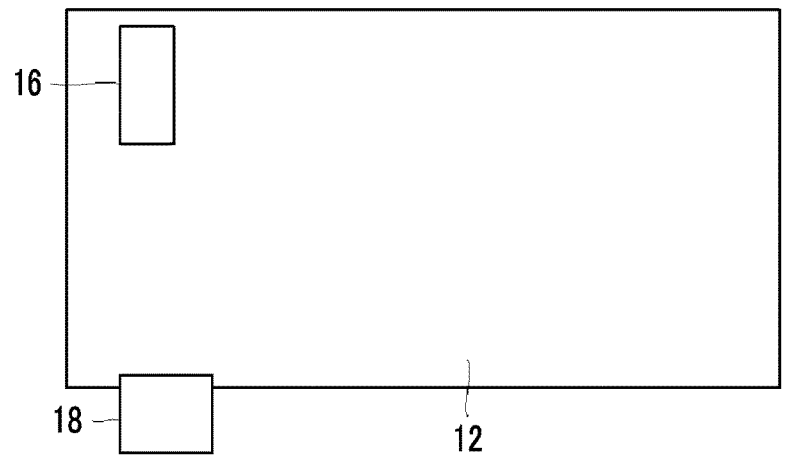
FIGS. 5A to 5C are conceptual views illustrating an example of a manufacturing method of a matrix device of the present invention.

First, as illustrated in FIG. 5A, the substrate 12 provided with the Y driver IC 16 and the X driver IC 18 is prepared.

Figure 5B:
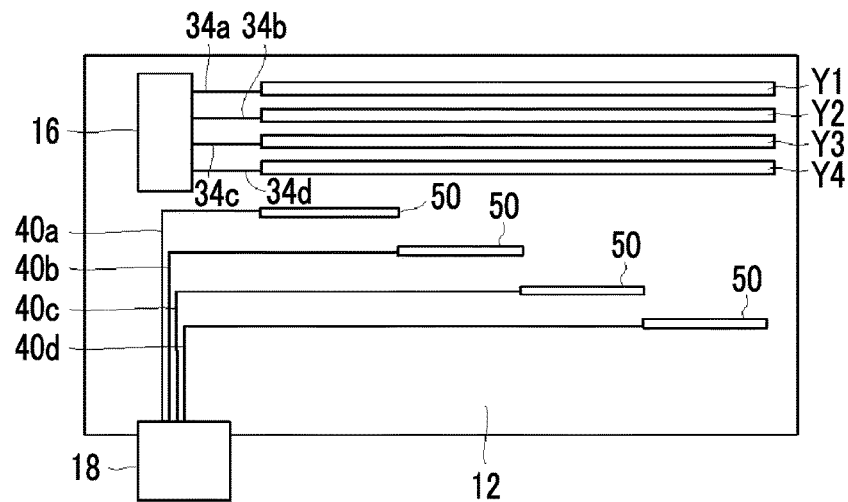

Next, the gate electrode 50 is formed on the substrate 12. Preferably, as illustrated in FIG. 5B, simultaneously with the formation of the gate electrode 50, the pixel electrodes Y1 to Y4, the selection wires 34a to 34d, and the switch wires 40a to 40d are also formed. That is, simultaneously with the gate electrode 50, an electrode group of a system different from the electrode group of the system corresponding to this gate electrode, wires connected to this electrode group, and wires connected to the gate electrode are formed.

Therefore, in this case, the gate electrodes 50, the pixel electrodes Y1 to Y4, the selection wires 34a to 34d, and the switch wires 40a to 40d are formed of the same material.

The formation of the gate electrodes 50 and the like may be performed by a known method used for manufacturing a matrix device such as vacuum deposition using a mask.

Next, insulating films are formed in necessary regions on the substrate 12, such as regions on the pixel electrodes Y1 to Y4 and regions covering the gate electrodes 50. The insulating film covering the gate electrodes 50 becomes the gate insulating film 52.

The formation of the insulating film may also be performed by a known method used for manufacturing a matrix device such as vacuum deposition using a mask.

Figure 5C:

Next, as illustrated in FIG. 5C, the semiconductor layer 54 is formed on the gate insulating film 52.

As described above, the formation of the semiconductor layer 54 may also be performed by a known method such as a coating method in which a paint obtained by dissolving an organic semiconductor which is to become the semiconductor layer 54 is applied by an edge-casting method and dried. Here, it is preferable that the application of the paint is performed in the direction of current flow of the source electrode 56 and the drain electrode 60 in the switching element. That is, in the example shown in FIG. 5C, it is preferable to apply the paint in the vertical direction of the figure. Accordingly, the crystal forming direction of the organic semiconductor is coincident with the direction of current flow, and thus the switching element with high efficiency can be formed.

As a forming method of the semiconductor layer 54 such as the edge-casting method, a deposition method, a printing method, a method of adhering the semiconductor layer 54 formed in a sheet shape, and the like are exemplified. However, in a case of using the organic semiconductor, a coating method is preferably used for the reason that an organic semiconductor layer with good crystallinity can be obtained and the like.

The semiconductor layer 54 may be cut or divided for each of individual switching elements or may be common to all the switching elements of the switching element group. Whether or not the semiconductor layer 54 is shared by being individually divided may be determined according to the accuracy required for the switching element and the like.

Figure 6A:
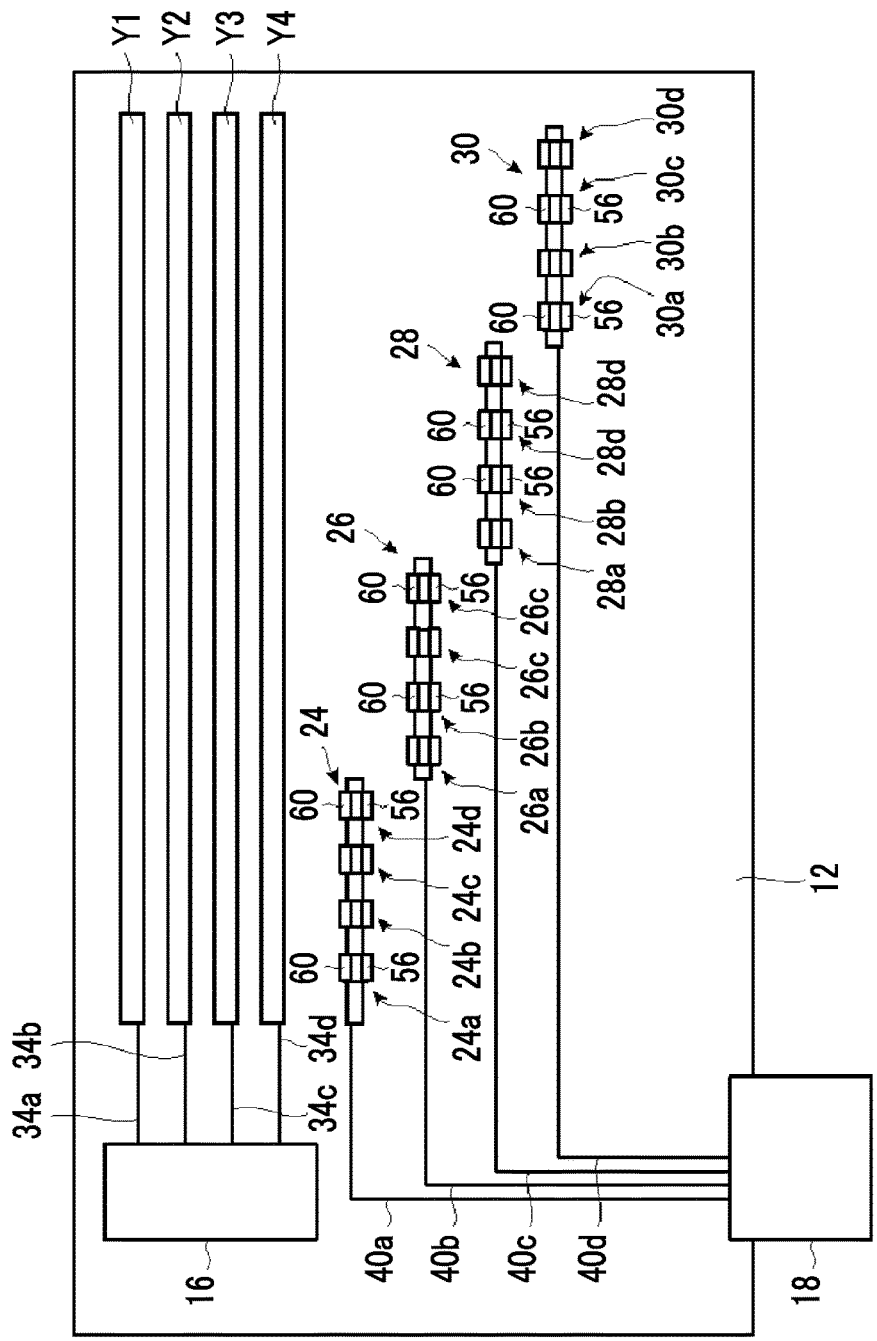

Next, as illustrated in FIG. 6A, by forming the source electrodes 56 and the drain electrodes 60 corresponding to the individual switching elements, the switching elements 24a to 24d, the switching elements 26a to 26d, the switching elements 28a to 28d, and the switching elements 30a to 30d are formed.

The formation of the source electrodes 56 and the drain electrodes 60 may also be performed by a known method used for manufacturing a matrix device such as vacuum deposition using a mask.

Lastly, as illustrated in FIG. 6B, the pixel electrodes X0 to Xf and the connection wires 36a to 36d are formed, thereby completing the matrix device 10 illustrated in FIG. 1. The forming material of the pixel electrodes X0 to Xf and the connection wires 36a to 36d may be the same or different from each other.

The formation of the pixel electrodes X0 to Xf and the connection wires 36a to 36d may also be performed by a known method used for manufacturing a matrix device such as vacuum deposition using a mask.

As is apparent from the above description, according to the present invention using the switching elements formed of the semiconductor, the gate electrode 50 and the gate insulating film 52 are used by the switching element group consisting of a plurality of the switching elements in common, and the gate electrodes 50, the pixel electrodes Y1 to Y4, the selection wires 34a to 34d, and the switch wires 40a to 40d can be simultaneously formed. Therefore, the matrix device 10 can be manufactured with good productivity.

In addition, the number of wires is small and the wires can be simplified. Furthermore, the gate electrode 50 is used by the plurality of switching elements in common. Therefore, the formation of the wires and the formation of the source electrode 56 and the drain electrode 60 do not require an accuracy as high as that of a typical matrix device. Therefore, the production of the matrix device 10 can be simplified, and the production efficiency can be improved.

In the manufacturing method illustrated in FIGS. 5A to 6B, the gate electrodes 50, the pixel electrodes Y1 to Y4, the selection wires 34a to 34d, and the switch wires 40a to 40d are simultaneously formed. However, the manufacturing method of the present invention is not limited thereto.

For example, during the formation of the gate electrodes 50, only the gate electrodes 50 may be formed, only the gate electrodes 50 and the pixel electrodes Y1 to Y4 may be simultaneously formed, or the gate electrodes 50 and the switch wires 40a to 40d may be simultaneously formed. Alternatively, the gate electrodes 50, the pixel electrodes Y1 to Y4, and the selection wires 34a to 34d may be simultaneously formed.

However, in consideration of productivity, it is preferable to simultaneously form the gate electrodes 50, the pixel electrodes Y1 to Y4, the selection wires 34a to 34d, and the switch wires 40a to 40d as in the illustrated example.

The switching elements are not limited to the configurations illustrated in FIGS. 2A and 2B, and various configurations can be used.

Figure 7:
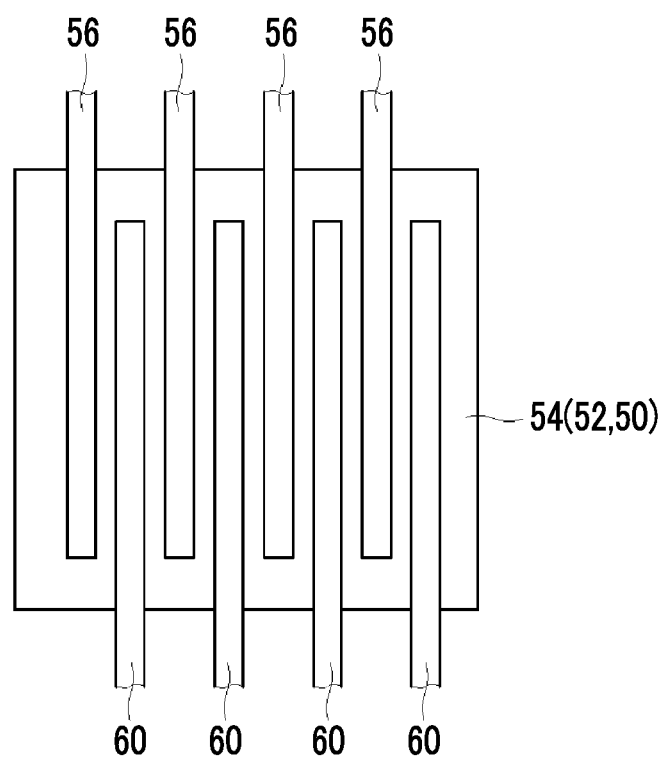
FIG. 7 is a conceptual view illustrating another example of the switching element used in the matrix device of the present invention.

For example, as illustrated in FIG. 7, in order to increase the amount of current, a configuration may be provided in which the source electrodes 56 and the drain electrodes 60 are elongated so as to face each other in the width direction, thereby increasing the channel width.

In a case of using the organic semiconductor for the switching elements having the configuration illustrated in FIG. 7, it is preferable that a continuous edge-casting method or the like is used to form the semiconductor layer 54, the paint is applied in the horizontal direction of FIG. 7, and the crystals of the organic semiconductor are grown in the horizontal direction, that is, the direction of the channel length.

Although the matrix device 10 illustrated in FIG. 1 performs XY scanning as the matrix scanning, the present invention is not limited thereto and can be used for devices performing matrix scanning of various known methods.

As the matrix scanning, in addition to XY scanning, various types of scanning for scanning surfaces such as display, sensing, vibration, micromotion, and the like on a predetermined surface portion with a plurality of signals, including rθ scanning, X1X2Y scanning using two pixel electrode systems, X1Y1Y2 scanning using two pixel electrode systems, and the like can be used. Among these, XY scanning is preferable.

In addition, the matrix device of the present invention can be used in various devices using, matrix scanning including various display devices such as LCDs, organic EL displays, and electronic papers, various sensors such as touch panels and tablet terminals, and position control devices using vibrating piezoelectric elements.

As described above, the matrix device and the manufacturing method of a matrix device of the present invention are described in detail, but the present invention is not limited to the examples described above, and various improvements or modifications may be perfoinied within a range not deviating from the gist of the present invention.

Applications to devices that perform matrix scanning such as liquid crystal displays and manufacturing thereof are possible.

EXPLANATION OF REFERENCES 10, 70, 76: matrix device
12: substrate
16, 100: Y driver IC
18, 102a, 102b, 102c, 102d: X driver IC
24, 26, 28, 30: switching element group
24a, 24b, 24c, 24d, 26a, 26b, 26c, 26d, 28a, 28b, 28c, 28d, 30a, 30b, 30c, 30d: switching element
34a, 34b, 34c, 34d, 106: selection wire
36a, 36b, 36c, 36d, 108: connection wire
40a, 40b, 40c, 40d: switch wire
50: gate electrode
52: gate insulating film
54: semiconductor layer
56: source electrode
60: drain electrode
72: driver IC
Y1, Y2, Y3, Y4: pixel electrode
X0, X1, X2, X3, X4, X5, X6, X7, X8, X9, Xa, Xb, Xc, Xd, Xe, Xf: pixel electrode

What is claimed is:

1. A matrix device comprising:
   at least two systems of electrode groups each consisting of a plurality of pixel electrodes that are elongated and do not intersect each other, the pixel electrodes of the electrode group of one system intersecting those of the other system,
   wherein
   the electrode group of at least one system is grouped into a plurality of groups each consisting of a plurality of the pixel electrodes,
   the matrix device includes
      branched wires connected to the pixel electrodes of the system divided into the plurality of groups so that the same signal is not supplied to the pixel electrodes of the same group but the same signal is supplied to one pixel electrode of each group, and
      switching elements using an organic semiconductor which are provided corresponding to the individual pixel electrodes of the system divided into the plurality of groups,
   a gate electrode and a gate insulating film of the switching elements are common to the switching elements corresponding to the pixel electrodes of the same group,
   the gate electrode of the switching elements and at least one of the pixel electrodes of the electrode group of the system different from that of the electrode group corresponding to the switching elements, wires connected to the pixel electrodes of the electrode group of the system different from that of the electrode group corresponding to the switching elements and a wire connected to the gate electrode are formed of the same material in a same layer, and
   a crystal forming direction of the organic semiconductor is coincident with a direction of current flow of a source electrode and a drain electrode in the switching element.

2. The matrix device according to claim 1,
   wherein the switching elements are formed on a substrate on which the electrode groups are formed.

3. The matrix device according to claim 1, further comprising:
   a logic circuit provided on the wire connected to the gate electrode.

4. A manufacturing method of a matrix device comprising:
   in a case where a matrix device which includes at least two systems of electrode groups, each consisting of a plurality of pixel electrodes that are elongated and do not intersect each other and is formed by intersecting the pixel electrodes of the electrode groups of the respective systems is manufactured, the matrix device having the electrode group of at least one system being grouped into a plurality of groups each consisting of a plurality of the pixel electrodes, and switching elements provided corresponding to the individual pixel electrodes of the electrode group that is grouped,
   a gate forming step of forming a gate electrode common to all the switching elements corresponding to the individual pixel electrodes of the same group;
   an insulating film forming step of forming a gate insulating film common to all the switching elements corresponding to the individual pixel electrodes of the same group;
   a semiconductor layer forming step of forming an organic semiconductor layer on the gate insulating film by a coating method; and
   a source/drain forming step of forming a source electrode and a drain electrode forming each of the switching elements corresponding to the individual pixel electrodes of the same group,
   wherein, in the gate forming step, simultaneously with the forming of the gate electrode, at least one of the pixel electrodes of the electrode group of the system different from that of the electrode group corresponding to the gate electrode, wires connected to the pixel electrodes of the electrode group of the system different from that of the electrode group corresponding to the gate electrode and a wire connected to the gate electrode is formed of a same material in a same layer, and
   wherein, in the semiconductor layer forming step, an application of a paint is performed in a direction of current flow of a source electrode and a drain electrode in the switching element by the coating method to form the organic semiconductor layer.

\* \* \* \* \*